(12) United States Patent  
Kim et al.

(10) Patent No.: US 12,051,680 B2  
(45) Date of Patent: Jul. 30, 2024

(54) SEMICONDUCTOR PACKAGE ALIGNING INTERPOSER AND SUBSTRATE

(71) Applicant: SAMSUNG ELECTRONICS CO., LTD., Suwon-si (KR)

(72) Inventors: Tae Hwan Kim, Asan-si (KR); Hyung Gil Baek, Suwon-si (KR); Young-Ja Kim, Cheonan-si (KR); Kang Gyune Lee, Suwon-si (KR); Sang-Won Lee, Seoul (KR); Yong Kwan Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/735,158

(22) Filed: May 3, 2022

(65) Prior Publication Data

US 2023/0120252 A1  Apr. 20, 2023

(30) Foreign Application Priority Data

Oct. 20, 2021  (KR) .......................... 10-2021-0139927

(51) Int. Cl.  
*H01L 25/16* (2023.01)  
*H01L 23/00* (2006.01)  
*H01L 23/498* (2006.01)

(52) U.S. Cl.  
CPC ...... *H01L 25/162* (2013.01); *H01L 23/49833* (2013.01); *H01L 23/49838* (2013.01);

(Continued)

(58) Field of Classification Search  
CPC .................. H01L 24/32; H01L 25/162; H01L 2224/73204; H01L 2225/06593; H01L 25/105  
See application file for complete search history.

(56) References Cited

U.S. PATENT DOCUMENTS 7,659,604 B2   2/2010 Fujiwara et al.  
8,884,445 B2 * 11/2014 Lee .................. H01L 24/81  
                                             257/E23.068

(Continued)

FOREIGN PATENT DOCUMENTS

JP   H08203956 A        8/1996  
JP   2001313496 A  * 11/2001 ... H01L 2224/45124

(Continued)

*Primary Examiner* — Ali Naraghi  
*Assistant Examiner* — E. Rhett Cheek  
(74) *Attorney, Agent, or Firm* — Fish & Richardson P.C.

(57) ABSTRACT

A semiconductor package may include; a first substrate, a first semiconductor chip disposed on the first substrate, an interposer disposed on the first semiconductor chip, a connecter spaced apart from the first semiconductor chip in a first horizontal direction and extending between the first substrate and the interposer, wherein the connecter directly electrically connects the first substrate and the interposer, a capacitor disposed between the connecter and the first semiconductor chip, and a guide pattern including a first guide portion and an opposing second guide portion spaced apart in the first horizontal direction, wherein the first guide portion is disposed between the connecter and the capacitor, the second guide portion is disposed between the capacitor and the first semiconductor chip, and at least part of the capacitor is inserted between the first guide portion and the second guide portion.

18 Claims, 13 Drawing Sheets

(52) U.S. Cl.
CPC .............. *H01L 24/16* (2013.01); *H01L 24/32* (2013.01); *H01L 24/73* (2013.01); *H01L 25/165* (2013.01); *H01L 23/49816* (2013.01); *H01L 2224/16225* (2013.01); *H01L 2224/32225* (2013.01); *H01L 2224/73204* (2013.01); *H01L 2924/16235* (2013.01); *H01L 2924/16251* (2013.01); *H01L 2924/165* (2013.01); *H01L 2924/1659* (2013.01); *H01L 2924/182* (2013.01)

(56) References Cited

U.S. PATENT DOCUMENTS

| | | | |
|---|---|---|---|
| 9,796,583 B2 * | 10/2017 | Coppeta | H01L 23/10 |
| 10,256,192 B2 | 4/2019 | Yi et al. | |
| 10,727,212 B2 | 7/2020 | Moon et al. | |
| 2008/0054490 A1 | 3/2008 | Mclellan et al. | |
| 2012/0306075 A1 * | 12/2012 | Kim | H01L 25/105 |
| | | | 257/738 |
| 2014/0139985 A1 | 5/2014 | Shih | |
| 2015/0130041 A1 * | 5/2015 | Seo | H01L 23/3128 |
| | | | 438/109 |
| 2015/0221625 A1 * | 8/2015 | Chun | H01L 23/4334 |
| | | | 257/707 |
| 2019/0103364 A1 * | 4/2019 | Kim | H01L 25/0657 |
| 2023/0290761 A1 * | 9/2023 | Wu | H01L 23/5384 |

FOREIGN PATENT DOCUMENTS

| | | |
|---|---|---|
| JP | 2001313496 A | 11/2001 |
| JP | 2004327641 A | 11/2004 |
| JP | 2005158770 A | 6/2005 |
| JP | 2010177559 A | 8/2010 |
| KR | 20190133907 A | 12/2019 |

* cited by examiner

SEMICONDUCTOR PACKAGE ALIGNING INTERPOSER AND SUBSTRATE

CROSS-REFERENCE TO RELATED APPLICATION

This application claims priority under 35 U.S.C. 119 to Korean Patent Application No. 10-2021-0139927 filed on Oct. 20, 2021 in the Korean Intellectual Property Office, the subject matter of which is hereby incorporated by reference in its entirety.

BACKGROUND

1. Technical Field

The inventive concept relates generally to semiconductor packages.

2. Description of the Related Art

In response to consumer demands for expanded functionality of electronic devices, and particularly mobile electronic devices, the size of high-performance semiconductor chips has increased. Accordingly, the size of semiconductor packages has also increased. In contrast, in response to consumer demands for slimmer profile electronic devices, the overall thickness of semiconductor packages has decreased. That is, contemporary and emerging semiconductor packages are being developed to satisfy the demands for expanded functionality, greater data storage and data processing capacities, and continuing size reductions of electronic devices, as well as constituent elements, components and systems.

In order to address one or more of these demands, multiple semiconductor chips are packaged within a single semiconductor package. Such multi-chip systems are capable of providing high data storage capacities, high data processing capacities, and expanded functionality while significantly reducing the size of semiconductor packages.

SUMMARY

In some embodiments of the inventive concept, a semiconductor package including an interposer and a substrate may properly aligned the interposer and the substrate during assembly by inserting a capacitor into a guide pattern disposed between the substrate and the interposer.

According to some embodiments of the inventive concept, a semiconductor package may include; a first substrate, a first semiconductor chip disposed on the first substrate, an interposer disposed on the first semiconductor chip, a connecter spaced apart from the first semiconductor chip in a first horizontal direction and extending between the first substrate and the interposer, wherein the connecter directly electrically connects the first substrate and the interposer, a capacitor disposed between the connecter and the first semiconductor chip, and a guide pattern including a first guide portion and an opposing second guide portion spaced apart in the first horizontal direction, wherein the first guide portion is disposed between the connecter and the capacitor, the second guide portion is disposed between the capacitor and the first semiconductor chip, and at least part of the capacitor is inserted between the first guide portion and the second guide portion.

According to some embodiments of the inventive concept a semiconductor package may include; a first substrate, a first semiconductor chip disposed on the first substrate, an interposer disposed on the first semiconductor chip, a capacitor disposed between the first substrate and the interposer in contact with one of an upper surface of the first substrate and a lower surface of the interposer, and a guide pattern disposed between the first substrate and the interposer in contact with another one of the upper surface of the first substrate and the lower surface of the interposer, wherein at least part of the capacitor is inserted within the guide pattern.

According to some embodiments of the inventive concept, a semiconductor package may include; a substrate, a first semiconductor chip disposed on the substrate and electrically directly connected to the substrate, an interposer disposed on the first semiconductor chip, support portions disposed between the first semiconductor chip and the interposer, a second semiconductor chip disposed on the interposer, a connecter between the substrate and the interposer and spaced apart from the first semiconductor chip in a first horizontal direction, wherein the connecter directly electrically connects the substrate and the interposer, a capacitor disposed between the connecter and the first semiconductor chip, wherein the capacitor contacts an upper surface of the substrate, and a guide pattern extending from a lower surface of the interposer towards the upper surface of the substrate. The guide pattern may contact the lower surface of the interposer, the guide pattern may be vertically spaced apart from the upper surface of the substrate, the guide pattern may include a first guide portion and a second guide portion spaced apart in the horizontal direction, wherein the first guide portion may be disposed between the connecter and the capacitor and the second portion may be disposed between the capacitor and the first semiconductor chip, at least part of the capacitor may be inserted between the first guide portion and the second guide portion, and the guide pattern may include the same material as the support portions.

BRIEF DESCRIPTION OF THE DRAWINGS

Various advantages, benefits, features and/or related aspects of the inventive concept may be more clearly understood upon consideration of the following detailed description, together with the accompanying drawings, in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
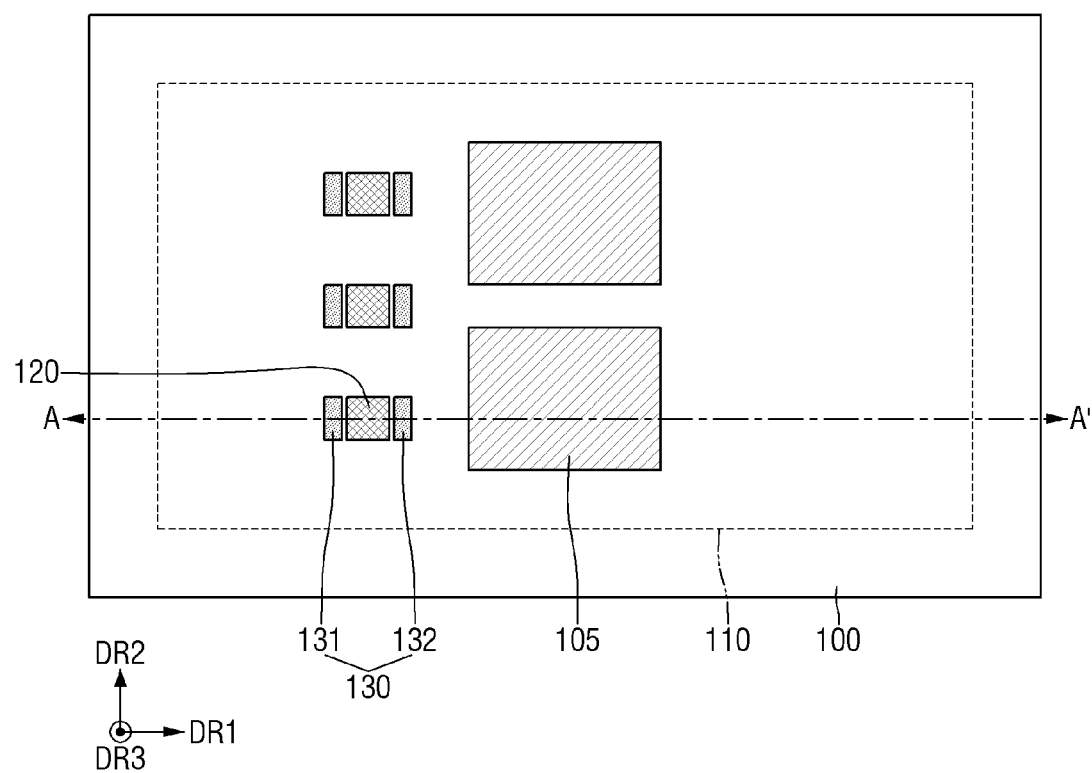
FIG. 1 is a plan view of a semiconductor package according to embodiments of the inventive concept.
Figure 2:
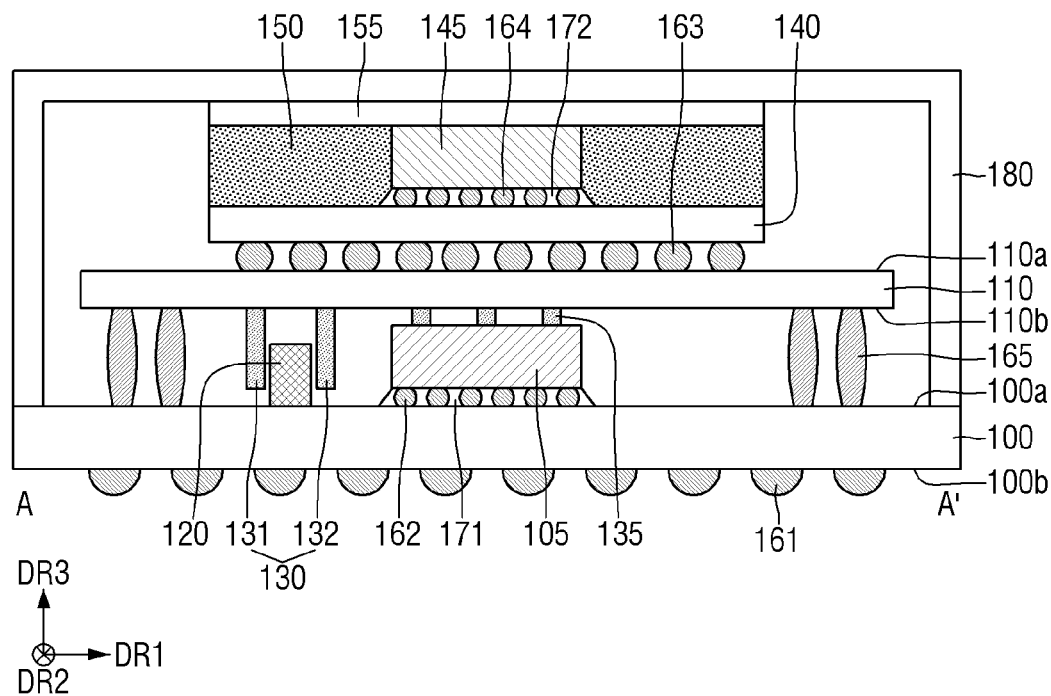
FIG. 2 is a cross-sectional view taken along line A-A' of FIG. 1.

Figure (FIG. 1 is a plan view illustrating a semiconductor package according to embodiments of the inventive concept, and FIG. 2 is a cross-sectional view taken along line A-A' of FIG. 1.

Referring to FIGS. 1 and 2, the semiconductor package includes a first substrate 100, a first semiconductor chip 105, an interposer 110, a capacitor 120, a guide pattern 130, support portions 135, a second substrate 140, a second semiconductor chip 145, a first mold layer 150, a heat conductive layer 155, first, second, third and fourth (hereafter collectively, "first to fourth") solder balls 161, 162, 163 and 164, direct connectors 165, first and second underfill materials 171 and 172, and a heat sink 180.

The substrate 100 may include at least one of, for example a printed circuit board (PCB) and a ceramic substrate.

When the substrate 100 is PCB, the substrate 100 may include at least one of, for example; phenolic resin, epoxy resin, polyimide, FR4, tetrafunctional epoxy, polyphenylene ether, epoxy/polyphenylene oxide, BT (bismaleimide triazine), thermount, cyanate ester, polyimide, and liquid crystal polymer.

First solder balls 161 may be disposed on a lower surface 100b of the substrate 100. In this regard, the first solder balls 161 may be used to contact conductive terminal(s) disposed on the lower surface 100b of the substrate 100. Hence, the first solder balls 161 may protrude convexly from the lower surface 100b of the substrate 100, and serve as respective, conductive contacts through which the substrate 100 may be electrically connected to one or more external elements.

Each of the first solder balls 161 may include at least one of, for example; tin (Sn), indium (In), lead (Pb), zinc (Zn), nickel (Ni), gold (Au), silver (Ag), copper (Cu), antimony (Sb), and bismuth (Bi).

The first semiconductor chip 105 may be disposed on an upper surface 100a of the first substrate 100. Here, the first semiconductor chip 105 may be a logic semiconductor chip—such as, for example; a micro-processor, a central processing unit (CPU), a controller, and an application specific integrated circuit (ASIC).

Second solder balls 162 may be disposed between the upper surface 100a of the first substrate 100 and a lower surface of the first semiconductor chip 105. That is, the second solder balls 162 may respectively contact conductive terminals disposed on the upper surface 100a of the substrate 100. The second solder balls 162 may also respectively contact conductive terminals disposed on the lower surface of the first semiconductor chip 105. In this manner, the first semiconductor chip 105 may be directly electrically connected to the first substrate 100 through the second solder balls 162.

Each of the second solder balls 162 may include at least one of, for example; Sn, In, Pb, Zn, Ni, Au, Ag, Cu, Sb, and Bi.

A first underfill material 171 may be disposed to substantially surround portions of the second solder balls 162 exposed between the substrate 100 and the first semiconductor chip 105. In some embodiments, the first underfill material 171 may laterally extend (e.g., in at least one of a first horizontal (or X-) direction (DR1) and a second horizontal (or Y-) direction (DR2) intersecting the first horizontal direction to protrude beyond lateral sidewall(s) of the first semiconductor chip 105.

An interposer 110 may be disposed on the first semiconductor chip 105. That is, the first semiconductor chip 105 may be disposed between the upper surface 100a of the first substrate 100 and a lower surface 110b of the interposer 110. Here, the interposer 110 may include at least one of, for example; silicon, glass, ceramic and plastic.

Various wirings (e.g., horizontal wiring patterns) and/or vias (e.g., vertical connection elements) may be disposed within the interposer 110. Here, the respective wirings may be electrically interconnected or electrically separated one from another, laterally spaced apart and/or disposed at different levels within the interposer 110. For example, respective vias may be used to vertically interconnect (e.g., in a vertical direction DR3) wirings disposed at different levels within the interposer 110.

One or more direct connectors 165 may be disposed between the first substrate 100 and the interposer 110. For example, two or more of the connecters 165 may be arranged in one or more pattern(s) (e.g., rows) between the first substrate 100 and the interposer 110. However, the connecters 165 may be laterally spaced apart from the first semiconductor chip 105 in one of the first horizontal direction and the second horizontal direction. In some embodiments, the connecters 165 may contact conductive terminals disposed on the upper surface 100a of the first substrate 100 and/or conductive terminals disposed on the lower surface 110b of the interposer 110. With this configuration, the interposer 110 may be "directly" (e.g., without additional intervening elements) electrically connected to the first substrate 100 through the connecters 165.

Each of the connecters 165 may include at least one of, for example; Sn, In, Pb, Zn, Ni, Au, Ag, Cu, Sb and Bi.

One or more support portions 135 may be variously disposed between the upper surface of the first semiconductor chip 105 and the lower surface 110b of the interposer 110. That is, each support portion 135 may contact the upper surface of the first semiconductor chip 105 and the lower surface 110b of the interposer 110. In some embodiments, the support portions 135 may include, for example; a Photo Solder Resist (PSR) ink, and may be formed as part of the interposer 110.

The capacitor 120 may also be disposed between the upper surface 100a of the first substrate 100 and the lower surface 110b of the interposer 110. For example, the capacitor 120 may be disposed on (e.g., extend vertically upward from) the upper surface 100a of the first substrate 100. That is, the capacitor 120 may contact the upper surface 100a of the first substrate 100. In some embodiments, the capacitor 120 may be vertically separated (e.g., spaced apart) from the lower surface 110b of the interposer 110.

In some embodiments, the capacitor 120 may be disposed between a connecter 165 or an arrangement of connecter 165 and the first semiconductor chip 105. That is, the capacitor 120 may be laterally spaced apart from the connecters 165 and the first semiconductor chip 105 in at least one of the first horizontal direction and the second horizontal direction. Although the illustrated example of FIG. 1 assumes three (3) capacitors 120 are regularly spaced apart in the second horizontal direction across the first substrate 100, this is merely one example, and any reasonable number and/or arrangement of capacitors 120 may be disposed on the first substrate 100.

In some embodiments, for example, the capacitor 120 may be a multilayer ceramic capacitor (MLC) or a low inductance chip capacitor (LOC).

The guide pattern 130 may also be disposed between the upper surface 100a of the first substrate 100 and the lower surface 110b of the interposer 110. For example, the guide pattern 130 may be disposed on (e.g., extend vertically downward from) the lower surface 110b of the interposer 110. That is, the guide pattern 130 may contact the lower surface 110b of the interposer 110. In some embodiments, the guide pattern 130 may be vertically separated (or spaced apart) from the upper surface 100a of the first substrate 100, but extend from the lower surface 110b of the interposer 110 towards the upper surface 100a of the first substrate 100.

In some embodiments, the guide pattern 130 may be disposed between the connecters 165 and the first semiconductor chip 105. That is, the guide pattern 130 may be spaced apart from each of the connecters 165 and the first semiconductor chip 105 in the first horizontal direction DR1.

The guide pattern 130 may be variously configured according to embodiments of the inventive concept. However, in one embodiment, the guide pattern 130 may include a first guide portion 131 and an opposing second guide portion 132 arranged to laterally bracket the capacitor 120 in the first horizontal direction. That is, the first guide portion 131 may be disposed between the connecters 165 and the capacitor 120, such that the first guide portion 131 is be spaced apart from the connecters 165 in the first horizontal direction. Thus, the first guide portion 131 may be disposed directly adjacent to one sidewall of the capacitor 120.

The second guide portion 132 may be spaced apart from the first guide portion 131 in the first horizontal direction, and disposed between the capacitor 120 and the first semiconductor chip 105. Hence, the first semiconductor chip 105 may be spaced apart from the second guide portion 132 in the first horizontal direction, and the second guide portion 132 may be disposed directly adjacent to the other sidewall opposite to the one sidewall of the capacitor 120 in the first horizontal direction.

In some embodiments, a thickness of the guide pattern 130 in the vertical direction may range from about 20 μm to about 100 μm.

In some embodiments, at least part of the capacitor 120 may be vertically introduced (or inserted) into the guide pattern 130. That is, at least an upper part the capacitor 120 may be inserted between the first guide portion 131 and the second guide portion 132 of the guide pattern 130. In this regard, the first and second guide portions 131, 132 of the guide pattern 130 may be respectively spaced apart from opposing sidewalls of the capacitor 120 in the first horizontal direction DR1. However, in other embodiments, at least one of the first guide portion 131 and the second guide portion 132 of the guide pattern 130 may contact a corresponding sidewall of the capacitor 120.

In some embodiments, the guide pattern 130 may include the same material(s) as the support portions 135. For example, the guide pattern 130 may include a PSR ink. In some embodiments, the guide pattern 130 may be formed as part of the interposer 110.

The second substrate 140 may be disposed on the upper surface 110a of the interposer 110. The second substrate 140 may include at least one of, for example; a PCB and a ceramic substrate.

Third solder balls 163 may be disposed between the upper surface 110a of the interposer 110 and the lower surface of the second substrate 140. That is, the third solder balls 163 may contact conductive terminals disposed on the upper surface 110a of the interposer 110 and/or conductive terminals disposed on the lower surface of the second substrate 140. The second substrate 140 may be directly electrically connected to the second substrate 140 through the third solder balls 163.

Each of the third solder balls 163 may include at least one of, for example; Sn, In, Pb, Zn, Ni, Au, Ag, Cu, Sb, and Bi.

The second semiconductor chip 145 may be disposed on the upper surface of the second substrate 140. In some embodiments, the second semiconductor chip 145 may be a High Bandwidth Memory (HBM) semiconductor chip. Alternately, the second semiconductor chip 145 may include a stacked arrangement of semiconductor chips, wherein each of the semiconductor chips in the stacked arrangement of semiconductor chips may be a volatile memory semiconductor chip (e.g., a dynamic random access memory (RAM) (DRAM) or static RAM (SRAM)), or a non-volatile memory semiconductor chip (e.g., phase-change RAM (PRAM), a magneto-resistive RAM (MRAM), a ferroelectric RAM (FeRAM) or a resistive RAM (RRAM).

Fourth solder balls 164 may be disposed between the upper surface of the second substrate 140 and the second semiconductor chip 145. Thus, the fourth solder balls 164 may contact conductive terminals disposed on the upper surface of the second substrate 140 and/or conductive terminals disposed on the lower surface of the second semiconductor chip 145. In this manner, the second semiconductor chip 145 may be directly electrically connected to the second substrate 140 through the fourth solder balls 164.

Each of the fourth solder balls 164 may include at least one of, for example; Sn, In, Pb, Zn, Ni, Au, Ag, Cu, Sb, and Bi.

A second underfill material 172 may be disposed to substantially surround sidewalls of the fourth solder balls 164 exposed between the upper surface of the second substrate 140 and the second semiconductor chip 145. In some embodiments, the second underfill material 172 may be formed to laterally protrude beyond the sidewalls of the second semiconductor chip 145.

The first mold layer 150 may be disposed on the upper surface of the second substrate 140 to substantially surround sidewalls of the second semiconductor chip 145 and sidewalls of the second underfill material 172. For example, the upper surface of the first mold layer 150 may be formed at the same horizontal plane as the upper surface of the second semiconductor chip 145 in some embodiments. The first mold layer 150 may include at least one of, for example; an epoxy molding compound (EMC) and one or more silicone hybrid materials.

The heat conductive layer 155 may be disposed on the upper surface of the first mold layer 150 and the upper surface of the second semiconductor chip 145. In some embodiments, for example, sidewalls of the heat conductive layer 155 may be vertically aligned with sidewalls of the first mold layer 150 and the sidewalls of the second substrate 140. The heat conductive layer 155 may include at least one of, for example; a silicon-based material, a thermosetting material, a thermoplastic material, a UV-treated material, a polymer and a resin.

The heat sink 180 may be thermally disposed on the upper surface 100a of the first substrate 100 through the heat conductive layer 155. That is, the heat sink 180 may be disposed in contact with the upper surface of the heat conductive layer 155 such that heat generated by the second semiconductor chip 145 is transferred (or conducted) towards the heat sink 180.

Hereinafter, an exemplary method of manufacture for a semiconductor package according to embodiments of the inventive concept will be described In relation to FIGS. 2, 3, 4, 5 and 6.

Figure 3:
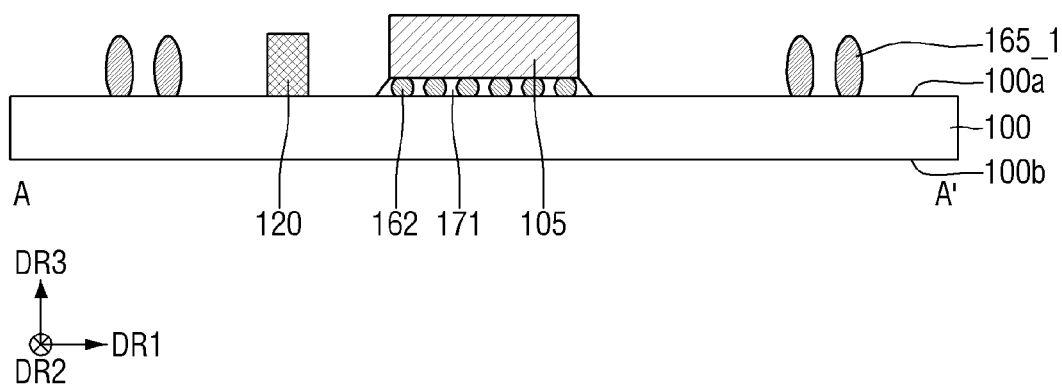
FIGS. 3, 4, 5 and 6 are related cross-sectional views illustrating in one example a method of manufacture for a semiconductor package according to embodiments of the inventive concept.

Referring to FIG. 3, the first semiconductor chip 105, the capacitor 120, and a first connecters 165_1 may be formed on the upper surface 100a of the first substrate 100.

The first semiconductor chip 105 may be attached to the upper surface 100a of the first substrate 100 through the second solder balls 162. The first underfill material 171 may be formed to substantially surround sidewalls of the second solder balls 162 exposed between the upper surface 100a of the first substrate 100 and the lower surface of the first semiconductor chip 105.

Lower connecters 165_1 may be formed near edge portions of the upper surface 100a of the first substrate 100 laterally spaced apart from the first semiconductor chip 105. The lower connecters 165_1 may be formed to extend vertically upward from the upper surface 100a of the first substrate 100. One or more capacitors 120 may be formed on the upper surface 100a of the first substrate 100 between the lower connecters 165_1 and the first semiconductor chip 105.

Figure 4:
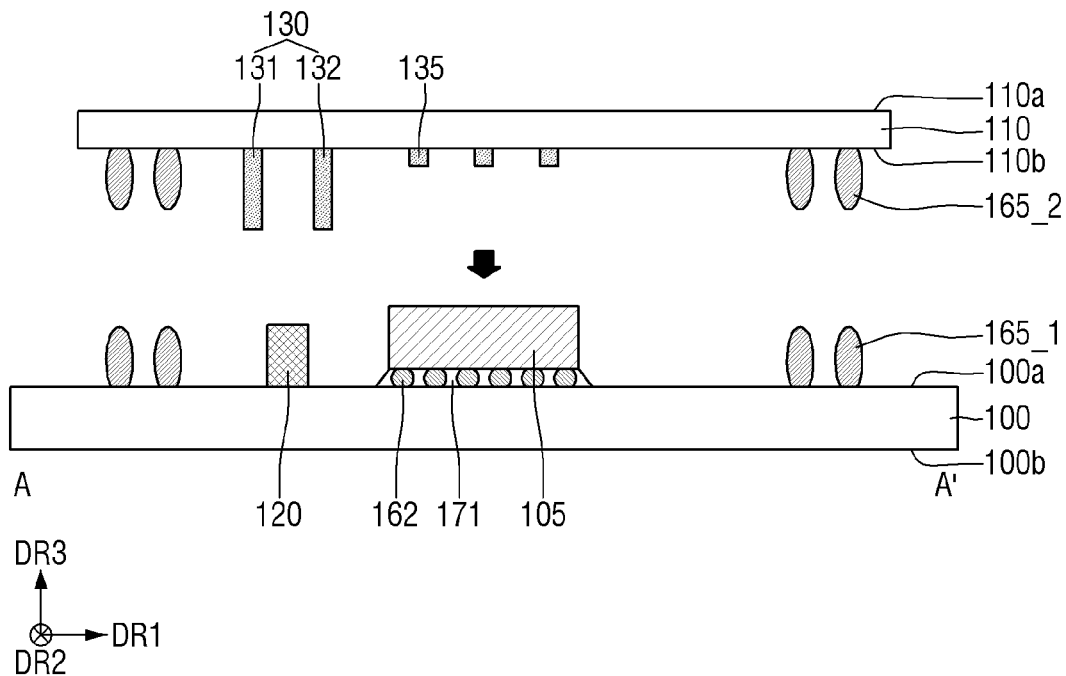

Referring to FIG. 4, the guide pattern 130, the support portions 135, and upper connecters 165_2 may be formed on the lower surface 110b of the interposer 110.

Here, the guide pattern 130 may be laterally arranged and disposed on the lower surface 110b of the interposer 110 in relation to the positioning of the capacitor 120 on the upper surface 100a of the first substrate 100, and may extend vertically downward from the lower surface 110b of the interposer 110.

In some embodiments, the guide pattern 130 may include the first guide portion 131 and the second guide portion 132 spaced apart from the first guide portion 131 in the first horizontal direction DR1.

The support portions 135 may be laterally arranged and disposed on the lower surface 110b of the interposer 110 in relation to the positioning of the first semiconductor chip 105.

Further, the upper connecters 165_2 may be laterally arranged and disposed on the lower surface 110b of the interposer 110 in relation to the positioning of the lower connecters 165_1, and may be formed to protrude from the lower surface 110b of the interposer 110.

Figure 5:
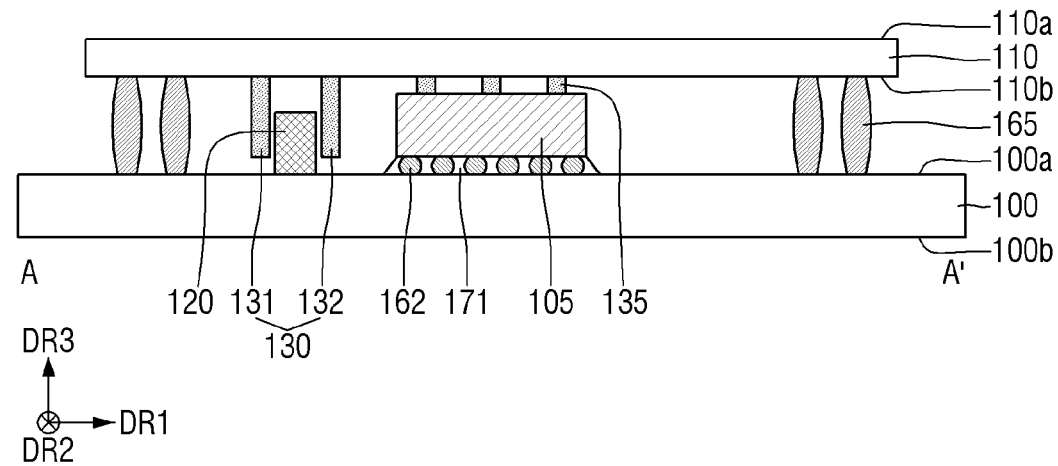

Referring to FIGS. 4 and 5, the lower surface 110a of the interposer 110 may now be attached to the upper surface 100a of the first substrate 100—and in so doing: (1) the support portions 135 may be attached to the upper surface of the first semiconductor chip 105; (2) respective upper connecters 165_2 may be attached to (of combined with) corresponding lower connecters 165_1 to form the connecters 165; and (3) at least part of the capacitor 120 may be inserted between the first guide portion 131 and the second guide portion 132 of the guide pattern 130.

Figure 6:
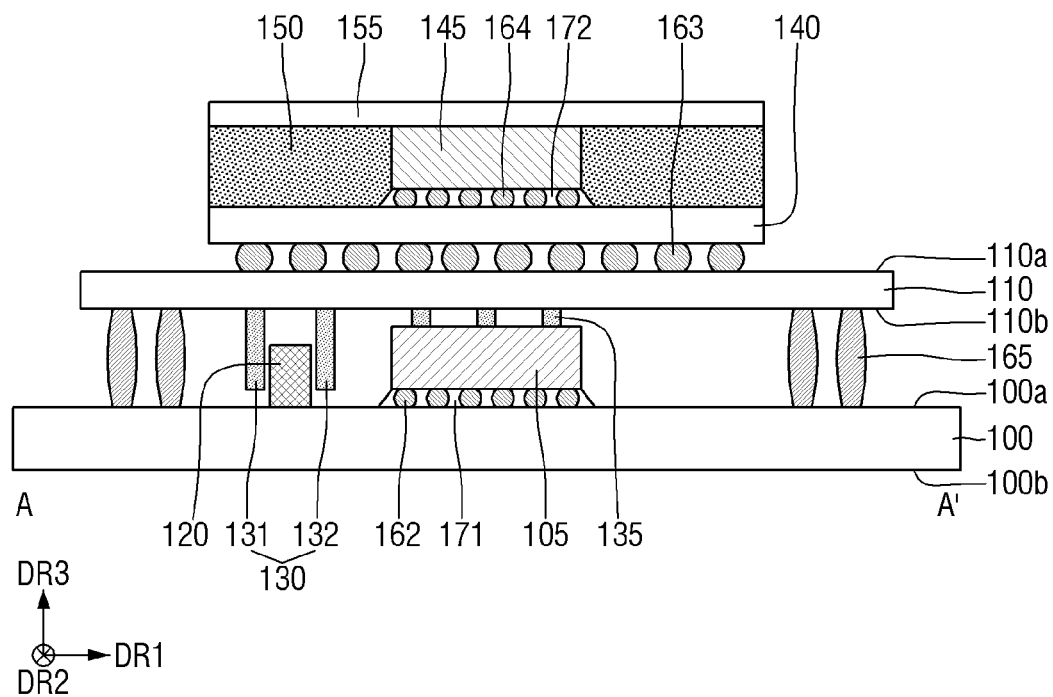

Referring to FIG. 6, the second semiconductor chip 145 may be attached to the upper surface of the second substrate 140 through the fourth solder balls 164, and the second underfill material 172 may be formed to substantially surround sidewalls of the fourth solder balls 164 exposed between the upper surface of the second substrate 140 and the lower surface of the second semiconductor chip 145.

Subsequently, the first mold layer 150 may be formed on the upper surface of the second substrate 140 to substantially surround sidewalls of the second semiconductor chip 145 and sidewalls of the second underfill material 172; the heat conductive layer 155 may be formed on the upper surface of the first mold layer 150 and the upper surface of the second semiconductor chip 145; and lower surface of the second substrate 140 may be attached to the upper surface 110a of the interposer 110 through the third solder balls 163.

Referring to FIGS. 2 and 6, the heat sink 180 may (optionally) be formed on the upper surface 110a of the first substrate 100 in contact with the upper surface of the heat conductive layer 155.

The semiconductor package according to some embodiments of the inventive concept may be disposed such that the capacitor 120 is inserted between the first guide portion 131 of the guide pattern 130 and the second guide portion 132 of the guide pattern 130. In the process of attaching the interposer 110 onto the first substrate 100, since the capacitor 120 is disposed to be inserted between the first guide portion 131 of the guide pattern 130 and the second guide portion 132 of the guide pattern 130, the interposer 110 and the first substrate 100 may be aligned. Therefore, the semiconductor package according to some embodiments of the inventive concept may prevent the interposer 110 from being misaligned on the first substrate 100.

Figure 7:
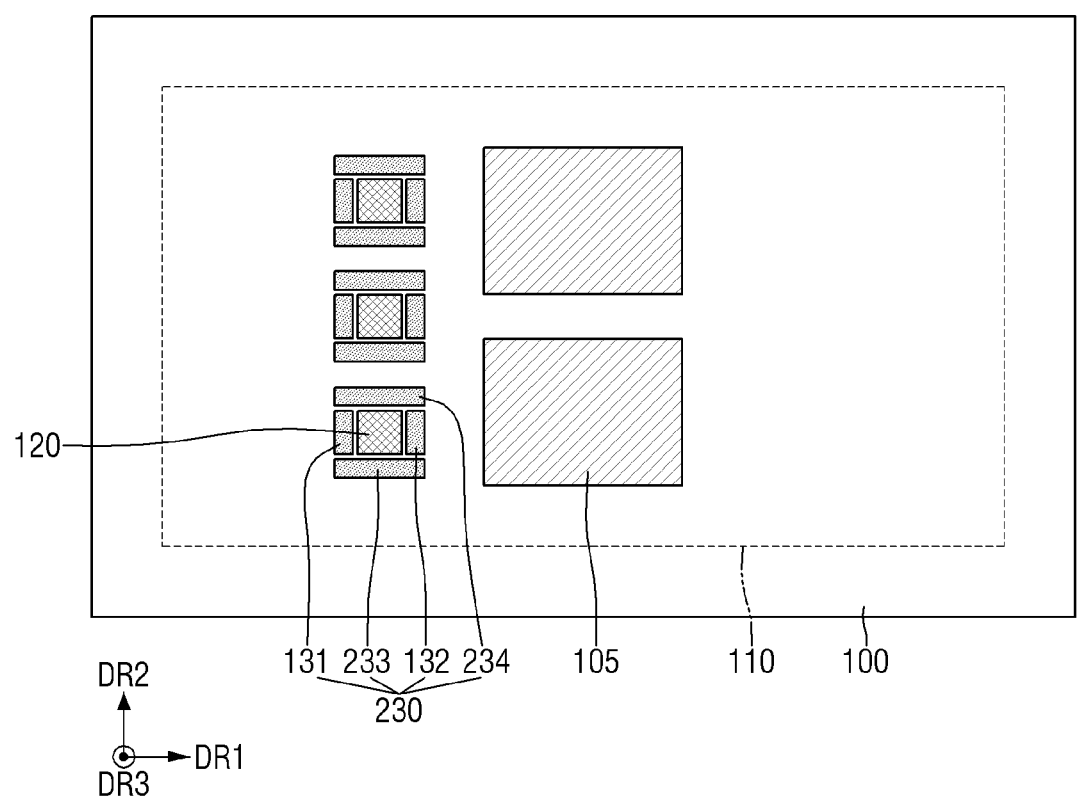
FIGS. 7 and 8 are respective plan views illustrating various semiconductor packages according to embodiments of the inventive concept.
Figure 8:
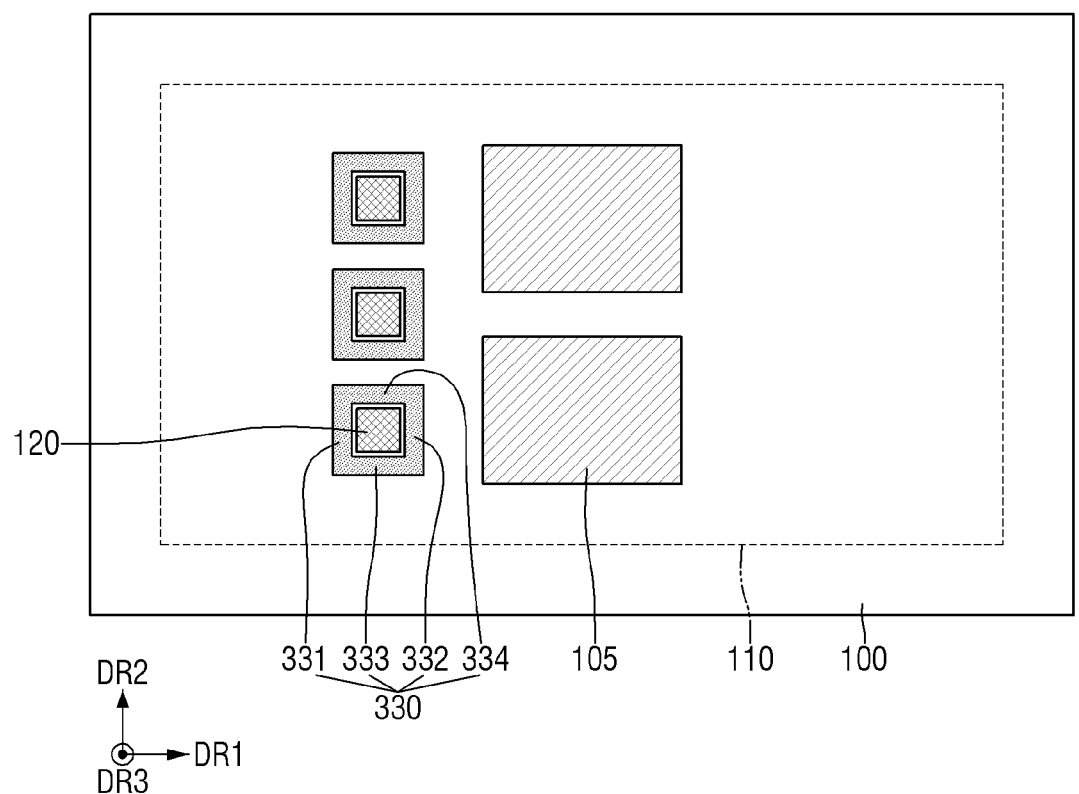

FIGS. 7 and 8 are respective plan views illustrating semiconductor packages according to embodiments of the inventive concept, and will be described primarily in relation to material differences with the semiconductor package of FIGS. 1 and 2.

Referring to FIG. 7, a guide pattern 230 including the first guide portion 131 and the opposing second guide portion 132, as well as a third guide portion 233 and an opposing fourth guide portion 234 may be included in a semiconductor package according to embodiments of the inventive concept, (e.g.,) as a replacement for the guide pattern 130 of FIGS. 1 and 2. Here, the capacitor 120 may be substantially surrounded by the guide pattern 230. That is, a combination of the first guide portion 131, the second guide portion 132, the third guide portion 233, and the fourth guide portion 234 (hereafter collectively, the "first to fourth guide portions 131, 132, 233, and 234") may substantially surround the capacitor 120 on four sides.

In some embodiments, the first guide portion 131 and the second guide portion 132 may each extend the second horizontal direction across the lower surface 110b of the interposer 110 and have a first end and an opposing second end. The third portion 233 may extend in the first horizontal direction and be disposed at (or proximate to) the respective first ends of the first guide portion 131 and the second guide portion 132, and the fourth portion 234 may extend in the first horizontal direction and be disposed at (or proximate to) the respective second ends of the first guide portion 131 and the second guide portion 132. Thus, the first guide portion 131 and the second guide portion 132 may be spaced apart in the first horizontal direction by a first gap sufficient to allow the introduction of at least part of the capacitor 120, and the third guide portion 233 and the fourth guide portion 234 may be spaced apart in the second horizontal direction by a second gap sufficient to allow the introduction of the at least part of the capacitor 120.

In some of embodiments, the first to fourth guide portions 131, 132, 233, and 234 may be respectively spaced apart from each other. Further, each of the first to fourth guide portions 131, 132, 233, and 234 may be respectively spaced apart from sidewalls of the capacitor 120. Alternately, at least one of the first to fourth guide portions 131, 132, 233 and 234 may contact a corresponding sidewall of the capacitor 120.

Referring to FIG. 8, a rectangularly-shaped guide pattern 330 including a first sidewall 331, a second sidewall 332, a third sidewall 333, and a fourth sidewall 334 (hereafter collectively, "first to fourth sidewalls 331, 332, 333 and 334") may be included in a semiconductor package according to embodiments of the inventive concept, (e.g.,) as a replacement for the guide pattern 130 of FIGS. 1 and 2.

Here, the capacitor 120 may be completely surrounded by the rectangularly-shaped guide pattern 330. That is, a combination of the first to fourth sidewalls 331, 32, 333, and 334 may surround the capacitor 120 on four sides, wherein the first to fourth sidewalls 331, 332, 333 and 334 are integrally formed within the rectangularly-shaped guide pattern 330. That is, the third sidewall 333 may be connected to one end of each of the first sidewall 331 and the second sidewall 332. Further, the fourth sidewall 334 may be connected to opposing ends of each of the first sidewall 331 and the second sidewall 332.

In some embodiments, each of the first to fourth sidewalls 331, 332, 333 and 334 of the guide pattern 330 may be spaced apart from sidewalls of the capacitor 120. Alternately, at least one of the first to fourth sidewalls 331, 332, 333 and 334 of the guide pattern 330 may contact a corresponding sidewall of the capacitor 120.

Figure 9:
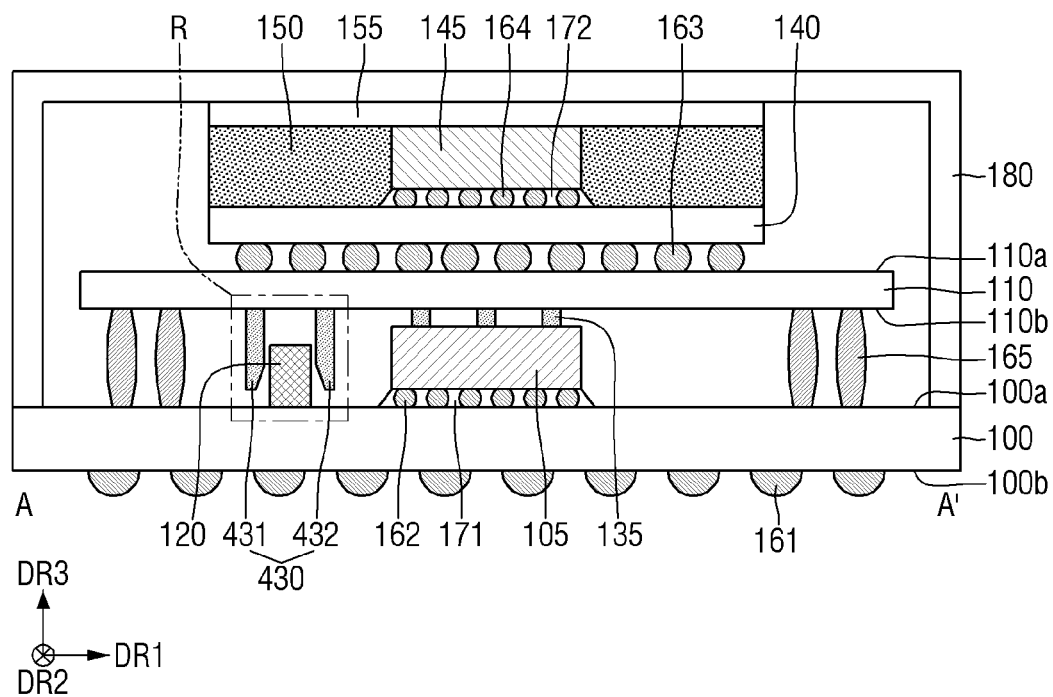
FIG. 9 is a cross-sectional view illustrating a semiconductor package according to embodiments of the inventive concept.
Figure 10:
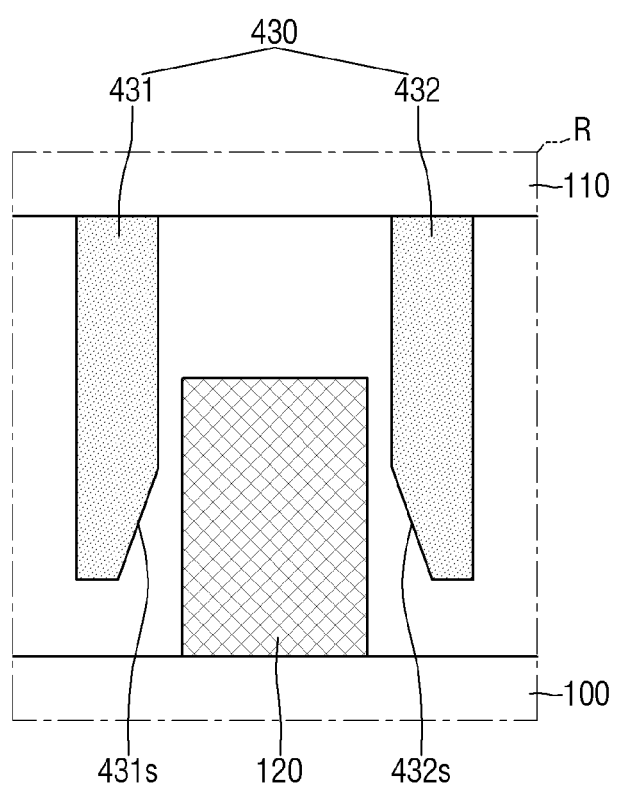
FIG. 10 is an enlarged view of region 'R' indicated in FIG. 9.

FIG. 9 is a cross-sectional view illustrating a semiconductor package according to embodiments of the inventive concept, and FIG. 10 is an enlarged view of region 'R' indicated in FIG. 9. Here, the semiconductor package of FIG. 9 may be compared with the semiconductor package of FIG. 2.

Referring to FIGS. 9 and 10, the semiconductor package may include a guide pattern 430 including a first guide portion 431 and an opposing second guide portion 432, wherein each of the first guide portion 431 and the second guide portion 432 includes an inner sidewall having an angled (or inclined) profile facing the capacitor 120.

For example, at least part of a first inner sidewall 431s of the first guide portion 431 facing the capacitor 120 may have an inclined profile, and at least part of a second inner sidewall 432s of the second guide portion 432 facing the capacitor 120 facing the capacitor 120 (and opposing the first inner sidewall 431s) may have an inclined profile.

Thus, a first separating gap (e.g., measured in the first horizontal direction) between the first inner sidewall 431s of the first guide portion 431 and the capacitor 120 may narrow as the first inner sidewall 431s extends towards the lower surface 110b of the interposer 110. In similar manner, a second separating gap (e.g., measured in the first horizontal direction) between the second inner sidewall 432s of the second guide portion 432 and the capacitor 120 may narrow as the second inner sidewall 432s extends towards the lower surface 110b of the interposer 110.

Figure 11:
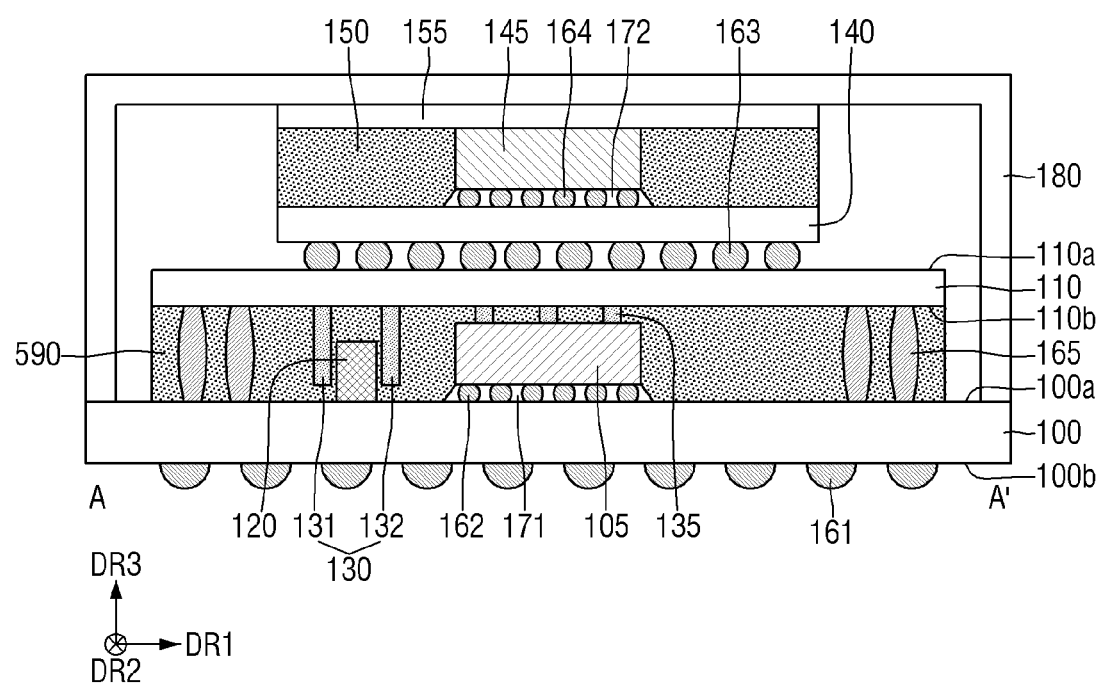
FIG. 11 is a cross-sectional view illustrating a semiconductor package according to embodiments of the inventive concept.

FIG. 11 is a cross-sectional view illustrating a semiconductor package according to embodiments of the inventive concept.

Referring to FIG. 11, a second mold layer 590 may be disposed between the upper surface 100a of the first substrate 100 and the lower surface 110b of the interposer 110. Here, the second mold layer 590 may substantially surround sidewalls and the upper surface of the first semiconductor chip 105, sidewalls of the first underfill material 171, sidewalls of the support portions 135, sidewalls and the upper surface of the capacitor 120, sidewalls and the lower surface of the guide pattern 130, and sidewalls of the connecters 165.

The second mold layer 590 may include material(s) different from each of the guide pattern 130 and the support portion 135. For example, the second mold layer 590 may include at least one of, for example; an epoxy molding compound (EMC) and two or more types of silicone hybrid materials.

Hereinafter, another method of manufacture for semiconductor packages according to embodiments of the inventive concept will be described in relation to FIGS. 12 and 13. The method of FIGS. 12 and 13 may be compare with the method of FIGS. 3, 4, 5, and 6.

Figure 12:
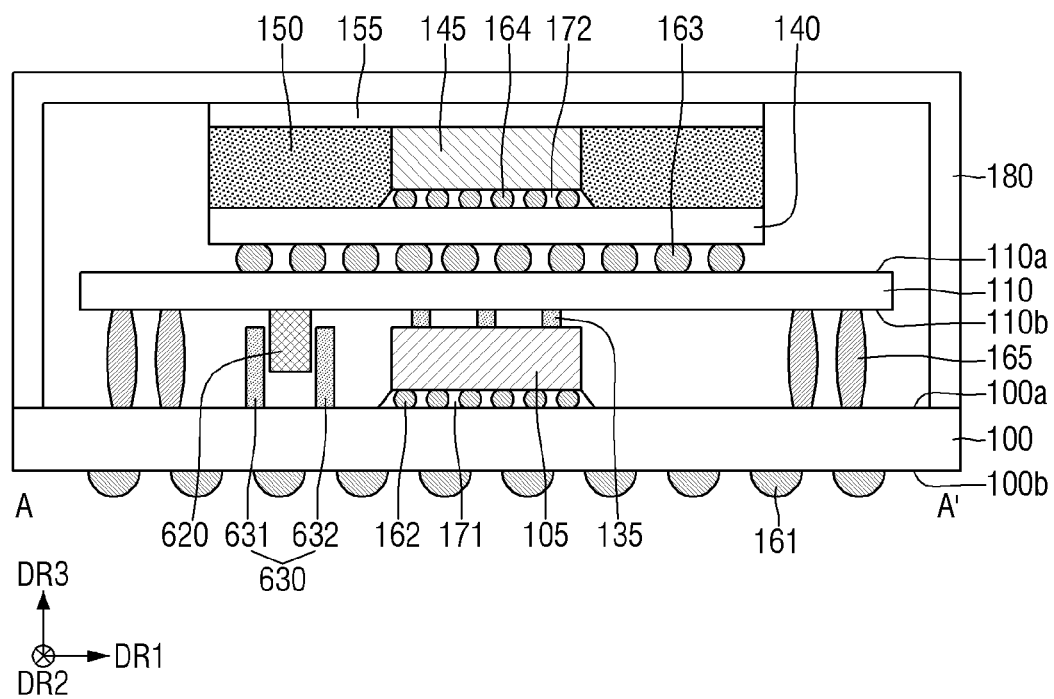
FIGS. 12 and 13 are related cross-sectional views illustrating in another example a method of manufacture for a semiconductor package according to embodiments of the inventive concept.
Figure 13:
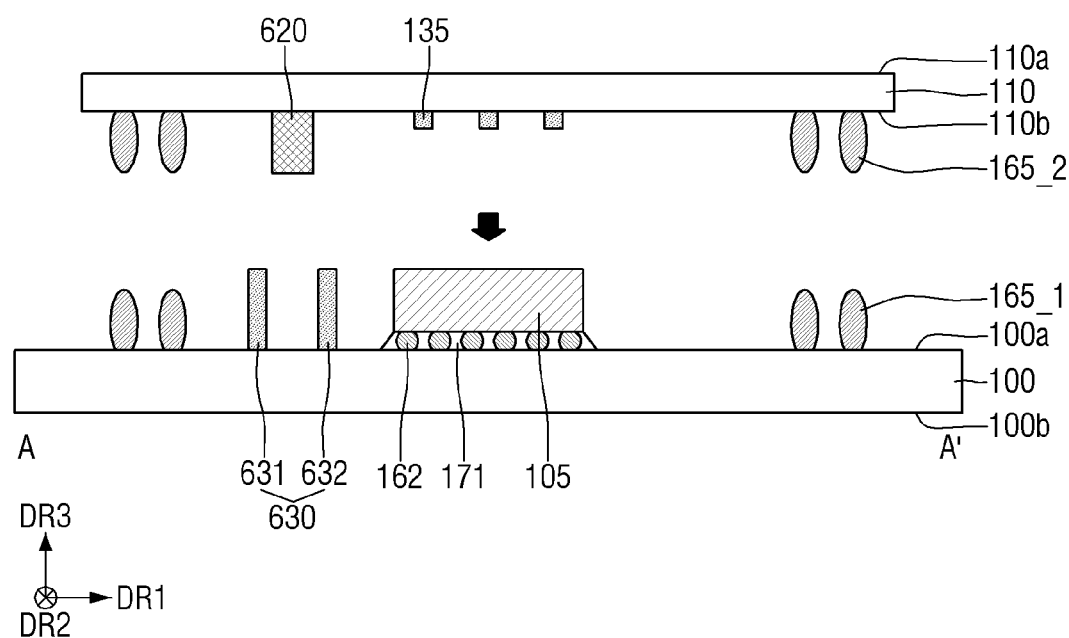

In this regard, FIG. 12 is a cross-sectional view illustrating a semiconductor package according to embodiments of the inventive concept, and FIG. 13 is cross-sectional view illustrating an intermediate stage of manufacture for the semiconductor package of FIG. 12.

Referring to FIG. 12, the semiconductor package may include, a capacitor 620 disposed on the lower surface 110b of the interposer 110, and a guide pattern 630 disposed on the upper surface 100a of the first substrate 100. That is, the capacitor 620 may contact the lower surface 110b of the interposer 110 and be vertically separated (or spaced apart) from the upper surface 100a of the first substrate 100.

The guide pattern 630 may contact the upper surface 100a of the first substrate 100 and be vertically separated (or spaced apart) from the lower surface 110b of the interposer 110. Thus, the guide pattern 630 may extend from the upper surface 100a of the first substrate 100 towards the lower surface 110b of the interposer 110. At least part of the capacitor 620 may be introduced (or inserted) between a first guide portion 631 and a second guide portion 632 of the guide pattern 630. In some embodiments, the guide pattern 630 may be formed as part of the first substrate 100.

Referring to FIG. 13, the lower surface 110b of the interposer 110 may be attached to the upper surface 100a of the first substrate 100 wherein the capacitor 620 attached to the lower surface 110b of the interposer 110 is aligned with and introduced into the guide pattern 630 attached to the upper surface 100a of the first substrate 100.

Figure 14:
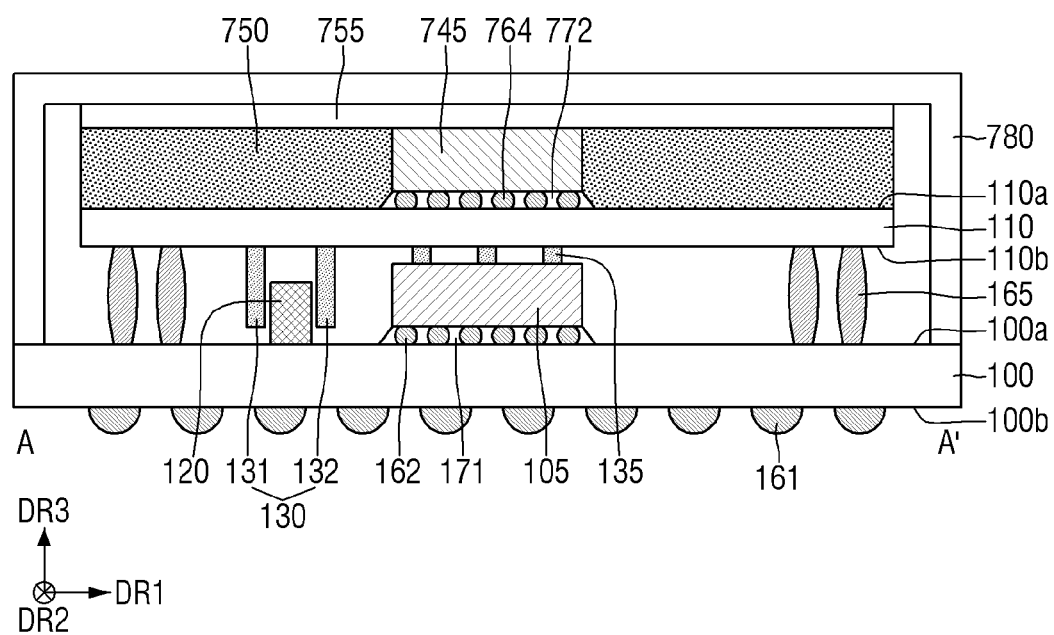
FIGS. 14 and 15 are respective cross-sectional views illustrating semiconductor packages according to embodiments of the inventive concept.

FIG. 14 is a cross-sectional view illustrating a semiconductor package according to embodiments of the inventive concept, and may be compared with the semiconductor package of FIGS. 1 and 2.

Referring to FIG. 14, the semiconductor package may include a second semiconductor chip 745 directly electrically connected to the interposer 110 (e.g., without provision of the second substrate 140).

Thus, the second semiconductor chip 745 may be disposed on the upper surface 110a of the interposer 110. Fourth solder balls 764 may be disposed between the upper surface 110a of the interposer 110 and the second semiconductor chip 745. The second semiconductor chip 745 may be directly electrically connected to the interposer 110 through the fourth solder balls 764. A second underfill material 772 may be disposed substantially surround sidewalls of the fourth solder balls 764 exposed between the upper surface 110a of the interposer 110 and the second semiconductor chip 745.

The first mold layer 750 may surround sidewalls of the second semiconductor chip 745 and sidewalls of the second underfill material 772 on the upper surface 110a of the interposer 110. The heat conductive layer 755 may be disposed on the upper surface of the first mold layer 750 and the upper surface of the second semiconductor chip 745. The heat sink 780 may be disposed on the upper surface 100a of the first substrate 100. The heat sink 780 may be disposed on the heat conductive layer 755. The heat sink 180 may be disposed in thermal contact with the upper surface of the heat conductive layer 755.

Figure 15:
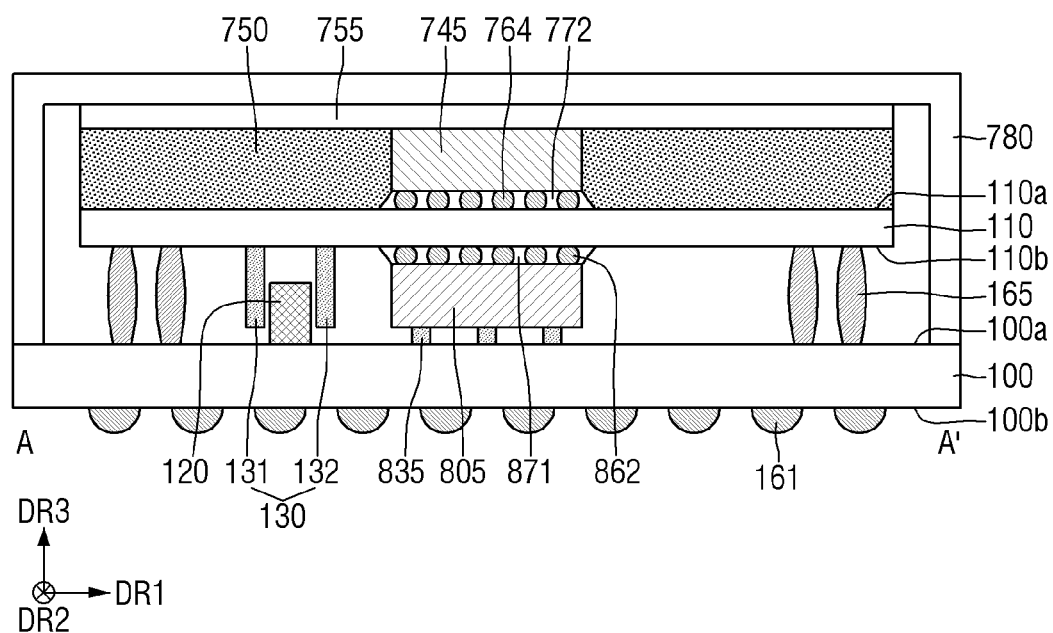

FIG. 15 is a cross-sectional view illustrating a semiconductor package according to embodiments of the inventive concept, and may be compared with the semiconductor package of FIGS. 1 and 2.

Referring to FIG. 15, the semiconductor package may include a first semiconductor chip 805 directly electrically connected to the lower surface 110b of the interposer 110, and a second semiconductor chip 745 directly electrically connected to the upper surface 110a of the interposer 110.

Here, the first semiconductor chip 805 may be disposed on the lower surface 110b of the interposer 110 with second solder balls 862 disposed between the lower surface 110b of the interposer 110 and the first semiconductor chip 805, such that the first semiconductor chip 805 may be directly electrically connected to the interposer 110 through the second solder balls 862. A first underfill material 871 may be disposed to substantially surround sidewalls of the second solder balls 862 exposed between the lower surface 110b of the interposer 110 and the first semiconductor chip 805. Support portions 835 may be disposed between the upper surface 100a of the first substrate 100 and the first semiconductor chip 105. In some embodiments, the support portions 835 may be formed as part of the first substrate 100.

From the foregoing detailed description, those skilled in the art will appreciate that many variations and modifications may be made to the illustrated embodiments without substantially departing from the principles of the inventive concept, as defined by the following claims.

What is claimed is:

1. A semiconductor package comprising:
   a first substrate;
   a first semiconductor chip disposed on the first substrate;
   an interposer disposed on the first semiconductor chip;
   a connecter spaced apart from the first semiconductor chip in a first horizontal direction and extending between the first substrate and the interposer, wherein the connecter directly electrically connects the first substrate and the interposer;
   a capacitor disposed between the connecter and the first semiconductor chip, wherein the capacitor contacts an upper surface of the first substrate; and
   a guide pattern including a first guide portion and an opposing second guide portion spaced apart in the first horizontal direction, wherein the first guide portion is disposed between the connecter and the capacitor, the second guide portion is disposed between the capacitor and the first semiconductor chip, at least part of the capacitor is inserted between the first guide portion and the second guide portion, the guide pattern contacts a lower surface of the interposer, a lower surface of the guide pattern is vertically spaced apart from the upper surface of the first substrate, and the lower surface of the guide pattern is lower than an upper surface of the first semiconductor chip.

2. The semiconductor package of claim 1, further comprising:
   a second semiconductor chip disposed on an upper surface of the interposer.

3. The semiconductor package of claim 2, further comprising:
   a second substrate between the upper surface of the interposer and the second semiconductor chip, wherein the second substrate is directly electrically connected to the interposer and the second semiconductor chip.

4. The semiconductor package of claim 2, wherein the second semiconductor chip is directly electrically connected to the interposer.

5. The semiconductor package of claim 1, wherein the guide pattern further includes a third guide portion and an opposing fourth guide portion spaced apart in a second horizontal direction, such that the capacitor is surrounded on four sides by the guide pattern.

6. The semiconductor package of claim 5, wherein the guide pattern has a rectangular shape, and
   the first guide portion, the second guide portion, the third guide portion and the fourth guide portion are integrally formed within the guide pattern.

7. The semiconductor package of claim 1, wherein a first inner sidewall of the first guide portion facing the capacitor has an inclined profile, and
   a second inner sidewall of the second guide portion facing the capacitor has an inclined profile.

8. The semiconductor package of claim 1, further comprising:
   a mold layer between the upper surface of the first substrate and the lower surface of the interposer,
   wherein the mold layer includes a material different from the guide pattern and surrounds the first semiconductor chip, the capacitor and the guide pattern.

9. The semiconductor package of claim 1, wherein the first semiconductor chip is directly electrically connected to the interposer.

10. The semiconductor package of claim 1, further comprising:
    support portions disposed between the first semiconductor chip and the lower surface of the interposer,
    wherein the guide pattern and the support portions include the same material.

11. A semiconductor package comprising:
    a first substrate;
    a first semiconductor chip disposed on the first substrate;
    an interposer disposed on the first semiconductor chip;
    a capacitor disposed between the first substrate and the interposer, the capacitor in contact with an upper surface of the first substrate; and
    a guide pattern disposed between the first substrate and the interposer, the guide pattern in contact with a lower surface of the interposer,
    wherein at least part of the capacitor is inserted within the guide pattern, a lower surface of the guide pattern is vertically spaced apart from the upper surface of the first substrate, and the lower surface of the guide pattern is lower than an upper surface of the first semiconductor chip.

12. The semiconductor package of claim 11, wherein the guide pattern includes a first guide portion and an opposing second guide portion spaced apart in a first horizontal direction, and
    the at least part of the capacitor is inserted between the first guide portion and the second guide portion.

13. The semiconductor package of claim 12, wherein the guide pattern further includes a third guide portion and a fourth guide portion in a second horizontal direction, such that the capacitor is surrounded by the guide pattern on four sides.

14. The semiconductor package of claim 12, wherein at least one of a first inner sidewall of the first guide portion facing the capacitor and a second inner sidewall of the second guide portion facing the capacitor has an inclined profile.

15. The semiconductor package of claim 11, further comprising:
a connecter between the first substrate and the interposer and spaced apart from the capacitor in a first horizontal direction, wherein the connecter directly electrically connects the first substrate and the interposer.

16. The semiconductor package of claim 11, further comprising:
a second substrate disposed on an upper surface of the interposer; and
a second semiconductor chip disposed on the second substrate.

17. The semiconductor package of claim 11, further comprising:
support portions disposed between the first semiconductor chip and the lower surface of the interposer,
wherein the guide pattern and the support portion include the same material.

18. A semiconductor package comprising:
a substrate;
a first semiconductor chip disposed on the substrate and electrically directly connected to the substrate;
an interposer disposed on the first semiconductor chip;
support portions disposed between the first semiconductor chip and the interposer;
a second semiconductor chip disposed on the interposer;
a connecter between the substrate and the interposer and spaced apart from the first semiconductor chip in a horizontal direction, wherein the connecter directly electrically connects the substrate and the interposer;
a capacitor disposed between the connecter and the first semiconductor chip, wherein the capacitor contacts an upper surface of the substrate; and
a guide pattern extending from a lower surface of the interposer towards the upper surface of the substrate,
wherein the guide pattern contacts the lower surface of the interposer,
a lower surface of the guide pattern is vertically spaced apart from the upper surface of the substrate,
the guide pattern includes a first guide portion and a second guide portion spaced apart in the horizontal direction,
the first guide portion is disposed between the connecter and the capacitor,
the second guide portion is disposed between the capacitor and the first semiconductor chip,
at least part of the capacitor is inserted between the first guide portion and the second guide portion,
the guide pattern includes the same material as the support portions, and
the lower surface of the guide pattern is lower than an upper surface of the first semiconductor chip.

* * * * *